(12) United States Patent
Zhang et al.

(10) Patent No.: US 10,241,145 B2
(45) Date of Patent: Mar. 26, 2019

(54) GATE DRIVING CIRCUIT AND METHOD FOR DETECTING SAME, ARRAY SUBSTRATE AND DISPLAY APPARATUS

(71) Applicants: BOE Technology Group Co., Ltd., Beijing (CN); Hefei Xinsheng Optoelectronics Technology Co., Ltd., Anui (CN)

(72) Inventors: Miao Zhang, Beijing (CN); Jinliang Liu, Beijing (CN); Mo Chen, Beijing (CN); Jing Sun, Beijing (CN); Songmei Sun, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 154 days.

(21) Appl. No.: 15/529,559

(22) PCT Filed: Jul. 1, 2016

(86) PCT No.: PCT/CN2016/088080
§ 371 (c)(1),
(2) Date: May 25, 2017

(87) PCT Pub. No.: WO2017/152553
PCT Pub. Date: Sep. 14, 2017

(65) Prior Publication Data
US 2018/0080973 A1    Mar. 22, 2018

(30) Foreign Application Priority Data
Mar. 10, 2016 (CN) .......................... 2016 1 0136463

(51) Int. Cl.
*G11C 19/28* (2006.01)
*G09G 3/36* (2006.01)
(Continued)

(52) U.S. Cl.
CPC ......... *G01R 31/2601* (2013.01); *G01R 31/00* (2013.01); *G09G 3/006* (2013.01);
(Continued)

(58) Field of Classification Search
CPC .... G01R 31/00; G01R 31/2601; G09G 3/006; G09G 3/3674; G09G 3/3677;
(Continued)

(56) References Cited

U.S. PATENT DOCUMENTS 7,408,376 B2   8/2008 Chang
8,223,108 B2   7/2012 Chang
(Continued)

FOREIGN PATENT DOCUMENTS

CN    1800926 A    7/2006
CN    101488310 A    7/2009
(Continued)

OTHER PUBLICATIONS

Office Action, including Search Report, for Chinese Patent Application No. 201610136463.X, dated Feb. 11, 2018, 17 pages.
(Continued)

*Primary Examiner* — Patrick O'Neill
(74) *Attorney, Agent, or Firm* — Westman, Champlin & Koehler, P.A.

(57) ABSTRACT

The present disclosure provides a gate driving circuit, a method for detecting the gate driving circuit, an array substrate and a display apparatus. The gate driving circuit comprises a plurality of cascaded gate driving units, access units, a first signal line and a second signal line. Each access unit is connected to its corresponding gate driving unit and
(Continued)

the gate driving unit at the next stage to its corresponding gate driving unit. The access unit corresponding to the gate driving unit at each odd stage is connected to the first signal line such that the first signal line detects an output signal from that gate driving unit via the access unit, and the access unit corresponding to the gate driving unit at each even stage is connected to the second signal line such that the second signal line detects an output signal from that gate driving unit via the access unit.

19 Claims, 5 Drawing Sheets

(51) Int. Cl.
| | | |
|---|---|---|
| *G01R 31/26* | (2014.01) | |
| *G01R 31/00* | (2006.01) | |
| *G11C 29/22* | (2006.01) | |
| *G11C 29/00* | (2006.01) | |
| *G11C 29/02* | (2006.01) | |
| *G11C 29/32* | (2006.01) | |
| *G11C 29/50* | (2006.01) | |
| *G11C 29/56* | (2006.01) | |
| *G09G 3/00* | (2006.01) | |

(52) U.S. Cl.
CPC ......... *G09G 3/3674* (2013.01); *G09G 3/3677* (2013.01); *G11C 19/28* (2013.01); *G11C 19/287* (2013.01); *G11C 29/00* (2013.01); *G11C 29/021* (2013.01); *G11C 29/22* (2013.01); *G11C 29/32* (2013.01); *G11C 29/50012* (2013.01); *G11C 29/56012* (2013.01); *G09G 2310/0286* (2013.01); *G11C 2029/3202* (2013.01); *G11C 2029/5602* (2013.01)

(58) Field of Classification Search
CPC ............ G09G 2310/0286; G11C 19/28; G11C 19/287; G11C 29/00; G11C 29/021; G11C 29/22; G11C 29/32; G11C 29/50012; G11C 29/56012; G11C 2029/3202; G11C 2029/5602
See application file for complete search history.

(56) References Cited

U.S. PATENT DOCUMENTS

| | | | |
|---|---|---|---|
| 8,248,356 B2 | 8/2012 | Chen | |
| 8,457,272 B2 | 6/2013 | Yokoyama et al. | |
| 8,937,691 B2 | 1/2015 | Sun et al. | |
| 9,589,664 B2* | 3/2017 | Lou | ........................ G11C 19/28 |
| 2004/0046920 A1 | 3/2004 | Hayata et al. | |
| 2016/0274387 A1 | 9/2016 | Zheng et al. | |
| 2016/0284259 A1* | 9/2016 | Wu | .................... G01R 31/2894 |

FOREIGN PATENT DOCUMENTS

| | | |
|---|---|---|
| CN | 101567160 A | 10/2009 |
| CN | 101861625 A | 10/2010 |
| CN | 102455553 A | 5/2012 |
| CN | 202383981 U | 8/2012 |
| CN | 103077674 A | 5/2013 |
| CN | 103698911 A | 4/2014 |
| CN | 104183225 A | 12/2014 |
| CN | 104656292 A | 5/2015 |
| CN | 105590607 A | 5/2016 |
| KR | 10-2008-0035086 A | 4/2008 |

OTHER PUBLICATIONS

First Office Action from Chinese Patent Application No. 201610136463.X, dated Jul. 27, 2017, 16 pages.
International Search Report and Written Opinion for International Application No. PCT/CN2016/088080, dated Dec. 1, 2016, 13 pages
English translation of International Search Report and Written Opinion for International Application No. PCT/CN2016/088080, dated Nov. 11, 2016, 12 pages.

* cited by examiner

1st Signal Line

2nd Signal Line

1st Signal Line

2nd Signal Line ical Field

GATE DRIVING CIRCUIT AND METHOD FOR DETECTING SAME, ARRAY SUBSTRATE AND DISPLAY APPARATUS

The present disclosure corresponds to PCT/CN2016088080, which claims a benefit from Chinese Patent Application No. 201610136463.X filed on Mar. 10, 2016, which is incorporated here by reference in its entirety.

TECHNICAL FIELD

The present disclosure relates to display technology, and more particularly, to a gate driving circuit, a method for detecting the gate driving circuit, an array substrate and a display apparatus.

BACKGROUND

Gate driver On Array (GOA) is a technique for integrating a gate driver integrated circuit of a Liquid Crystal Display (LCD) onto an array substrate. A GOA circuit has a number of cascaded GOA units each constituting a shift register. For a GOA unit at a particular stage, its input signal is an output signal from a GOA unit at its previous stage and its output signal is a reset signal for the GOA unit at its previous stage. The output signals from the GOAs at the respective stages are at high level sequentially for scanning an LCD panel on a per-line basis.

Since an output signal from a GOA unit at a particular stage is an input signal to the GOA unit at its next stage, an abnormality in the output signal from the GOA unit at the particular stage will cause abnormalities in the output signals from the subsequent GOA units, resulting in a display abnormality of an LCD panel eventually. In order to determine the defective GOA unit, typically the GOA units at the respective stages are connected to an oscilloscope sequentially. It can be determined whether the GOA unit at each stage is defective based on whether the waveform of the output signal from the GOA unit as displayed on the oscilloscope is normal or not. Hence, it is problematic at least in that connecting the GOA units at the respective stages to the oscilloscope sequentially is troublesome and inefficient for detection.

SUMMARY

The embodiments of the present disclosure provide a gate driving circuit, a method for detecting the gate driving circuit, an array substrate and a display apparatus.

In an aspect of the embodiments of the present disclosure, a gate driving circuit is provided. The gate driving circuit comprises a plurality of cascaded gate driving units, access units, a first signal line and a second signal line. Each access unit is connected to its corresponding gate driving unit and the gate driving unit at the next stage to its corresponding gate driving unit. The access unit corresponding to the gate driving unit at each odd stage is connected to the first signal line such that the first signal line detects an output signal from that gate driving unit via the access unit, and the access unit corresponding to the gate driving unit at each even stage is connected to the second signal line such that the second signal line detects an output signal from that gate driving unit via the access unit.

For example, the access unit corresponding to the gate driving unit at each odd stage is configured to connect an output terminal of its corresponding gate driving unit to the first signal line in response to an output signal from its corresponding gate driving unit and an output signal from the gate driving unit at the next stage to its corresponding gate driving unit. The access unit corresponding to the gate driving unit at each even stage is configured to connect an output terminal of its corresponding gate driving unit to the second signal line in response to an output signal from its corresponding gate driving unit and an output signal from the gate driving unit at the next stage to its corresponding gate driving unit.

For example, each access unit comprises a first transistor and a second transistor. A gate of the first transistor, a first terminal of the first transistor and a first terminal of the second transistor are each connected to an output terminal of the gate driving unit corresponding to the access unit. A gate of the second transistor is connected to an output terminal of the gate driving unit at the next stage to the gate driving unit corresponding to the access unit. A second terminal of the first transistor and a second terminal of the second transistor are each connected to the first signal line or the second signal line.

For example, the gate driving unit comprises a plurality of transistors and leads connected to the plurality of transistors, the first transistor and the second transistor are manufactured simultaneously with the plurality of transistors and the first signal line and the second signal line are manufactured simultaneously with the leads.

For example, the respective access units, the first signal line and the second signal line are arranged at respective output terminals of the gate driving units.

For example, one end of the first signal line and one end of the second signal line each have a test pad connected to an oscilloscope.

For example, the one end of the first signal line and the one end of the second signal line are located at one side of the gate driving circuit.

In another aspect of the embodiments of the present disclosure, an array substrate is provided. The array substrate comprises the above gate driving circuit.

In yet another aspect of the embodiments of the present disclosure, a display apparatus is provided. The display apparatus comprises the above array substrate.

In a further aspect of the embodiments of the present disclosure, a method for detecting the above gate driving circuit is provided. The method comprises: connecting each of the first signal line and the second signal line to an oscilloscope; displaying an output signal from the first signal line and an output signal from the second signal line on the oscilloscope; and determining one or more defective gate driving units based on variation in high and low levels in the output signal from the first signal line and the output signal from the second signal line.

BRIEF DESCRIPTION OF THE DRAWINGS

In order to illustrate the solutions according to the embodiments of the present application clearly, the figures used for description of the embodiments will be introduced briefly here. It is apparent to those skilled in the art that the figures described below only illustrate some embodiments of the present disclosure and other figures can be obtained from these figures without applying any inventive skills.

DETAILED DESCRIPTION OF THE EMBODIMENTS

In the following, the embodiments of the present disclosure will be described in further detail with reference to the figures, such that the objects, solutions and advantages of the present disclosure will become more apparent.

Figure 1:
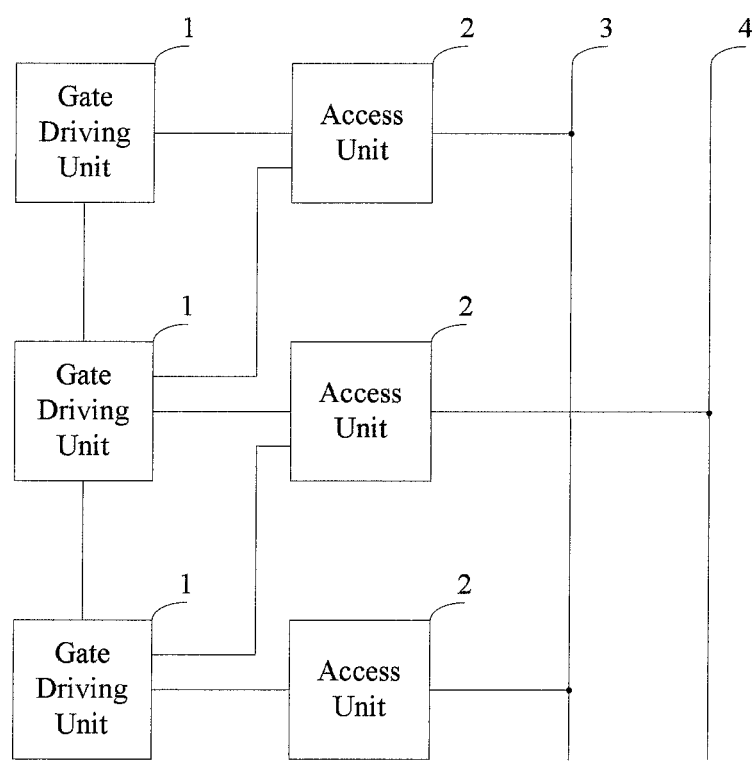
FIG. 1 is a schematic diagram showing a structure of a gate driving circuit according to an embodiment of the present disclosure.

According to an embodiment of the present disclosure, a gate driving circuit is provided. As shown in FIG. 1, the gate driving circuit includes a plurality of cascaded gate driving units 1 (only three are shown in FIG. 1 as an example), access units 2, a first signal line 3 and a second signal line 4. Each access unit 2 is connected to its corresponding gate driving unit 1 and the gate driving unit 1 at the next stage to its corresponding gate driving unit 1. The access unit 2 corresponding to the gate driving unit 1 at each odd stage is connected to the first signal line 3 such that the first signal line 3 detects an output signal from that gate driving unit 1 via the access unit 2, and the access unit 2 corresponding to the gate driving unit 1 at each even stage is connected to the second signal line 4 such that the second signal line 4 detects an output signal from that gate driving unit 1 via the access unit 2.

In this embodiment of the present disclosure, a first signal line detects an output signal from the gate driving unit at each odd stage and a second signal line detects an output signal from the gate driving unit at each even stage, such that the output signals from the gate driving units at the respective stages are accessible via the first and second signal lines. In this way, it is possible to detect whether any of the gate driving units at the respective stages is defective by simply connecting the first and second signal lines to an oscilloscope, respectively.

Figure 2:
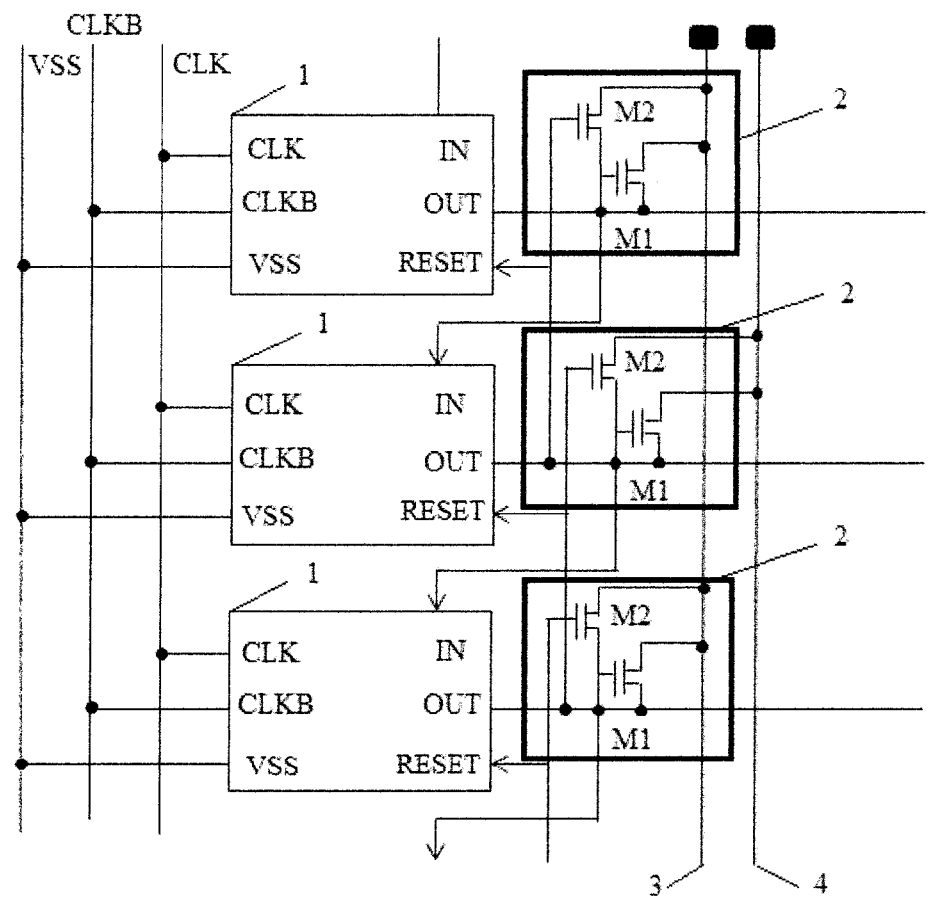
FIG. 2 is a schematic diagram showing an example of a gate driving circuit according to an embodiment of the present disclosure.

FIG. 2 is a schematic diagram showing an example of a gate driving circuit according to an embodiment of the present disclosure. As shown in FIG. 2, the gate driving circuit includes a plurality of cascaded gate driving units 1 (only three are shown in FIG. 2 as an example), access units 2, a first signal line 3 and a second signal line 4. Each access unit 2 is connected to its corresponding gate driving unit 1 and the gate driving unit 1 at the next stage to its corresponding gate driving unit 1. The access unit 2 corresponding to the gate driving unit 1 at each odd stage is connected to the first signal line 3 such that the first signal line 3 detects an output signal from that gate driving unit 1 via the access unit 2, and the access unit 2 corresponding to the gate driving unit 1 at each even stage is connected to the second signal line 4 such that the second signal line 4 detects an output signal from that gate driving unit 1 via the access unit 2.

It can be appreciated that, in order to detect whether a gate driving unit is defective via the first signal line and the second signal line, various signals will be inputted to the gate driving unit, including an input signal, IN, a clock signal, CLK, a inverse clock signal, CLKB, a reset signal, RESET, and a low voltage signal, VSS, such that the gate driving unit is in a working state (i.e., an on state).

In an implementation of this embodiment, the respective access units 2, the first signal line 3 and the second signal line 4 can be arranged at respective output terminals of the gate driving units 1, so as to facilitate wiring.

In practice, the respective access units 2, the first signal line 3 and the second signal line 4 can be arranged between the respective gate driving units 1 and a display area of an array substrate. The first signal line and the second signal line both extend from one side of a display screen of a display apparatus to the other.

In an implementation of this embodiment, one end of the first signal line 3 and one end of the second signal line 4 can each have a test pad connected to an oscilloscope.

It is to be noted here that the gate driving circuit is typically housed inside a display apparatus. By providing the test pads, the oscilloscope can be connected to the first and second signal lines for detection, without breaking the display apparatus. In this way, damages to the display apparatus and the gate driving units, as well as impacts on normal operations of the display apparatus, can be avoided, such that manpower and material resources can be saved and the efficiency and accuracy of the detection can be improved.

For example, the one end of the first signal line 3 and the one end of the second signal line 4, each having a test pad, are located at one side of the gate driving circuit, such that it is convenient for the oscilloscope to be connected to the first signal line 3 and the second signal line 4 for detection.

In practice, the test pad is provided on one side of a data pad which is configured to transfer data signals external to the display apparatus to inside the display apparatus, so as to control the content to be displayed on the display apparatus. In particular, the test pad and the data pad can be provided outside the housing of the display apparatus, such that the electric signals internal to the display apparatus can be obtained without breaking the housing of the display apparatus. For example, the test pad and the data pad can be provided outside the glue sealing the frame of the liquid crystal box, such that the probe of the oscilloscope can be connected to the test pad without breaking the liquid crystal box, thereby detecting whether the gate driving unit is defective.

In another implementation of the present disclosure, the access unit 2 corresponding to the gate driving unit 1 at each odd stage is configured to connect an output terminal of its corresponding gate driving unit 1 to the first signal line 3 in response to an output signal from its corresponding gate driving unit 1 and an output signal from the gate driving unit 1 at the next stage to its corresponding gate driving unit 1. The access unit 2 corresponding to the gate driving unit 1 at each even stage is configured to connect an output terminal of its corresponding gate driving unit 1 to the second signal line 4 in response to an output signal from its corresponding gate driving unit 1 and an output signal from the gate driving unit 1 at the next stage to its corresponding gate driving unit 1.

Referring to FIG. 2, each access unit 2 can include a first transistor M1 and a second transistor M2. A gate of the first transistor M1, a first terminal of the first transistor M1 and a first terminal of the second transistor M2 are each connected to an output terminal of the gate driving unit 1 corresponding to the access unit 2. A gate of the second transistor M2 is connected to an output terminal of the gate driving unit 1 at the next stage to the gate driving unit 1 corresponding to the access unit 2. A second terminal of the first transistor M1 and a second terminal of the second transistor M2 are each connected to the first signal line 3 or the second signal line 4. It can be appreciated that the use of transistors can achieve an effect of low cost.

In particular, when the gate driving unit 1 corresponding to the access unit 2 is a gate driving unit 1 at an odd stage, the second terminal of the first transistor M1 and the second terminal of the second transistor M2 are each connected to the first signal line 3. When the gate driving unit 1 corresponding to the access unit 2 is a gate driving unit 1 at an even stage, the second terminal of the first transistor M1 and the second terminal of the second transistor M2 are each connected to the second signal line 4.

In this embodiment, the first terminal is a drain and the second terminal is a source.

For example, each of the first transistor M1 and the second transistor M2 can be an N-type or P-type transistor, which is adaptive to different circuit requirements.

In an example in which each of the first transistor M1 and the second transistor M2 is an N-type transistor, the access unit 2 corresponding to the gate driving unit 1 at each odd stage is configured to connect the output terminal of its corresponding gate driving unit 1 to the first signal line 3 via the first transistor M1 when a high level is outputted from its corresponding gate driving unit 1 and connect the output terminal of its corresponding gate driving unit 1 to the first signal line 3 via the second transistor M2 when a high level is outputted from the gate driving unit 1 at the next stage to its corresponding gate driving unit 1. The access unit 2 corresponding to the gate driving unit 1 at each even stage is configured to connect the output terminal of its corresponding gate driving unit 1 to the second signal line 4 via the first transistor M1 when a high level is outputted from its corresponding gate driving unit 1 and connect the output terminal of its corresponding gate driving unit 1 to the second signal line 4 via the second transistor M2 when a high level is outputted from the gate driving unit 1 at the next stage to its corresponding gate driving unit 1.

In particular, when the output signal, OUT, from the gate driving unit 1 at a particular stage is at the high level, the first transistor M1 is turned on and the gate driving unit 1 at the particular stage outputs the output signal OUT at the high level via the first transistor M1. When the output signal from the gate driving unit 1 at the next stage is at the high level (at this time the output signal OUT from the gate driving unit 1 at the particular stage becomes low as the gate driving units at the respective stages output high levels sequentially), the second transistor M2 is turned on and the gate driving unit 1 at the particular stage outputs the output signal OUT at the low level via the second transistor M2.

In this embodiment, the high level and the low level are two opposite voltages. Typically, the low level can be 0~0.25V and the high level can be 3.5~5V.

For example, each of the first transistor M1 and the second transistor M2 can be a Thin Film Transistor (TFT), such that they can be manufactured using a process for a display apparatus.

For example, the gate driving unit 1 includes a plurality of transistors and leads connected to the plurality of transistors. The first transistor M1 and the second transistor M2 can be manufactured simultaneously with the plurality of transistors and the first signal line 3 and the second signal line 4 can be manufactured simultaneously with the leads. In this way, the process can be simplified and the cost can be reduced.

Figure 3:
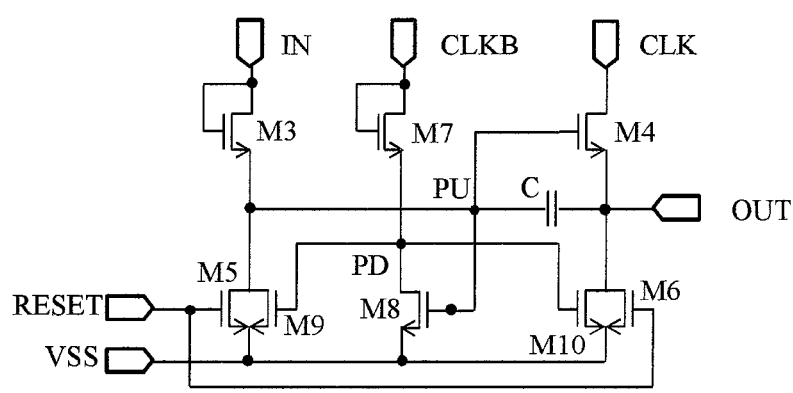
FIG. 3 is a schematic diagram showing a structure of a gate driving unit according to an embodiment of the present disclosure.

In particular, referring to FIG. 3, the gate driving unit 1 can include a capacitor C, a third transistor M3, a fourth transistor M4, a fifth transistor M5 and a sixth transistor M6. The third transistor M3 has its first terminal and connected to an input terminal of the input signal IN and its second terminal connected to a pull-up node, PU. The capacitor C has its first electrode connected to the pull-up node PU and its second electrode connected to an output terminal of the output signal OUT. The fourth transistor M4 has its first terminal connected to an input terminal of a clock signal, CLK, its second terminal connected to the output terminal of the output signal OUT, and its gate connected to the pull-up node PU. The fifth transistor M5 has its first terminal connected to the pull-up node PU, its second terminal connected to an input terminal of the low voltage signal VSS, and its gate connected to an input terminal of the reset signal RESET. The sixth transistor M6 has its first terminal connected to an the output terminal of the output signal OUT, its second terminal connected to the input terminal of the low voltage signal VSS, and its gate connected to the input terminal of the reset signal RESET.

It is to be noted here that, since the first signal line 3 and the second signal line 4 are connected to the first transistor M1 and the second transistor M2, referring to the above implementation, the leads manufactured simultaneously with the first signal line 3 and the second signal line 4 include leads connected to the respective gates of the third to sixth transistors M3~M6. In particular, in order to simplify the manufacture process, the leads connected to the respective gates of the third to sixth transistors M3~M6 include a connection line between the gate of the third transistor M3 and the input terminal of the input signal IN, a connection line between the gate of the fourth transistor M4 and the pull-up node PU, a connection line between the gate of the fifth transistor M5 and the input terminal of the reset signal RESET and a connection line between the gate of the sixth transistor M6 and the input terminal of the reset signal RESET. Further, the first signal line 3 and the second signal line 4 can be manufactured simultaneously with the respective gates of the first to sixth transistors M1~M6.

For example, each of the gate driving units 1 can further include a seventh transistor M7, an eighth transistor M8, a ninth transistor M9 and a tenth transistor M10. The seventh transistor M7 has its first terminal and gate connected to an input terminal of the inverse clock signal CLKB, and its second terminal connected to a pull-down node, PD. The eighth transistor M8 has its first terminal connected to the pull-down node PD, its second terminal connected to the input terminal of the low voltage signal VSS, and its gate connected to the pull-up node PU. The ninth transistor M9 has its first terminal connected to the pull-up node PU, its second terminal connected to the input terminal of the low voltage signal VSS, and its gate connected to the pull-down node PD. The tenth transistor M10 has its first terminal connected to the output terminal of the output signal OUT, its second terminal connected to the input terminal of the low voltage signal VSS, and its gate connected to the pull-down node PD.

In particular, each of the third to tenth transistors M3~M10 can be a TFT.

In particular, each of the third to tenth transistors M3~M10 can be an N-type or P-type transistor.

Figure 4:
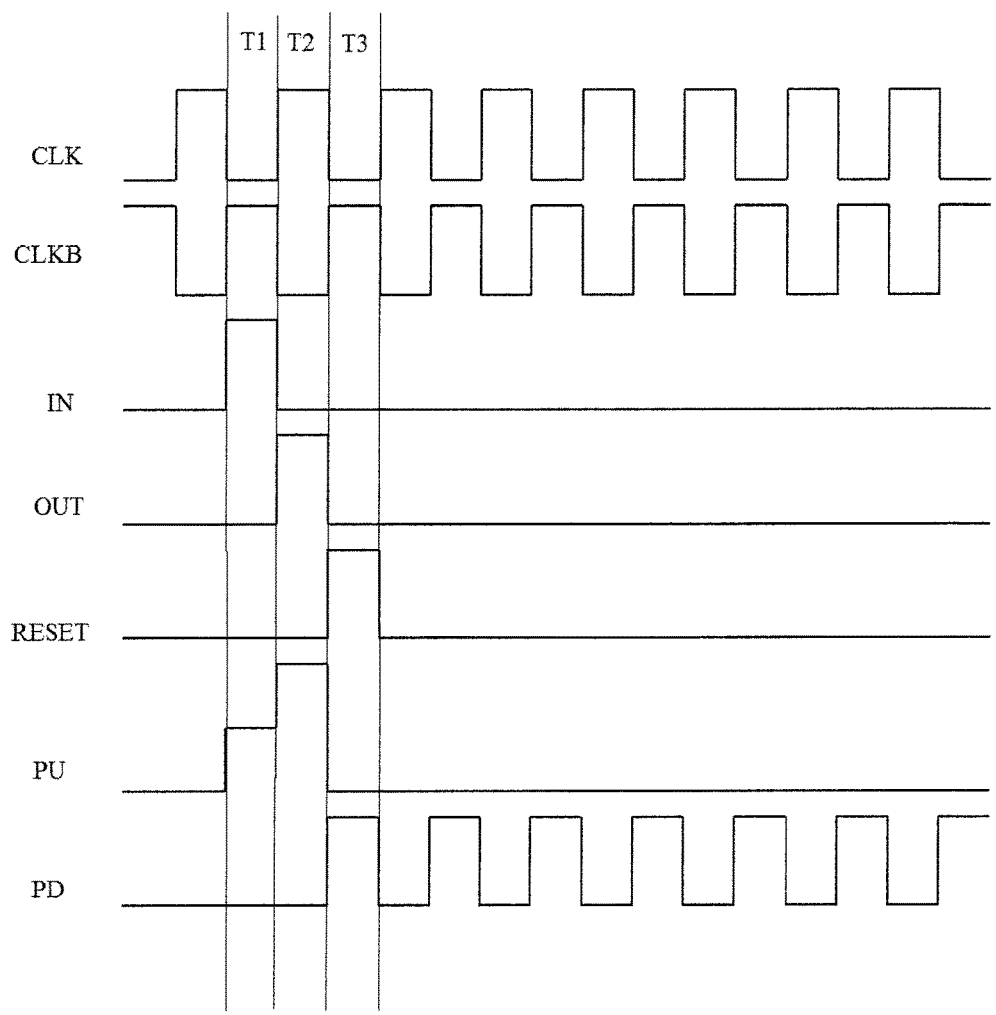
FIG. 4 is a timing sequence diagram of signals in a gate driving unit according to an embodiment of the present disclosure.

FIG. 4 is a timing sequence diagram of signals in a gate driving unit according to an embodiment of the present disclosure, e.g., when each of the first to tenth transistors M1~M10 is an N-type transistor. The timing sequence includes three phases: an input phase T1, an output phase T2 and a reset phase T3. It is to be noted that, while the timing sequence diagram of FIG. 4 is described assuming each transistor to be an N-type transistor, the present disclosure is not limited to this.

During the Input Phase T1:

The clock signal CLK is at the low level, the inverse clock signal CLKB is at the high level, the input signal IN is at the high level and the reset signal RESET is at the low level.

The control signal IN turns on the third transistor M3, and the voltage at the pull-up node PU is pulled up by the input signal IN. The fourth transistor M4 has a higher threshold voltage than the high level voltage of the input signal IN and is thus off. The output signal OUT is at the low level.

The inverse clock signal CLKB turns on the seventh transistor M7. The eighth transistor M8 is turned on under control of the voltage at the pull-up node PU. The pull-down node PD is at the low level. The ninth transistor M9 and the tenth transistor M10 are off.

Further, the reset signal RESET is at the low level and the fifth transistor M5 and the sixth transistor M6 are off.

During the Output Phase T2:

The clock signal CLK is at the high level, the inverse clock signal CLKB is at the low level, the input signal IN is at the low level and the reset signal RESET is at the low level.

The clock signal CLK is at the high level and, with the bootstrapping effect of equivalent capacitance in the fourth transistor M4, the voltage at the pull-up node PU is further pulled up to the threshold voltage of the fourth transistor M4, such that the fourth transistor M4 is turned on. The output signal OUT is at the high level.

The inverse clock signal CLKB is at the low level and the seventh transistor M7 is turned off. The eighth transistor M8 is on under control of the voltage at the pull-up node PU. The pull-down node PD is at the low level. The ninth transistor M9 and the tenth transistor M10 are off.

The reset signal RESET is at the low level and the fifth transistor M5 and the sixth transistor M6 are off. The input signal IN is at the low level and the third transistor M3 is off.

During the Reset Phase T3:

The clock signal CLK is at the low level, the inverse clock signal CLKB is at the high level, the input signal IN is at the low level and the reset signal RESET is at the high level.

The reset signal RESET is at the high level and the fifth transistor M5 and the sixth transistor M6 are turned on. The voltage at the pull-up node PU and the output signal OUT are reset.

Meanwhile, the inverse clock signal CLKB is at the high level and the seventh transistor M7 is turned on. The eighth transistor M8 is off under control of the voltage at the pull-up node PU. The pull-down node PD is at the high level and the ninth transistor M9 and the tenth transistor M10 are turned on, such that the voltage at the pull-up node PU and the output signal OUT are pulled down.

Further, the input signal IN is at the low level and the third transistor M3 is off. The fourth transistor M4 is off under control of the voltage at the pull-up node PU.

Figure 5A:
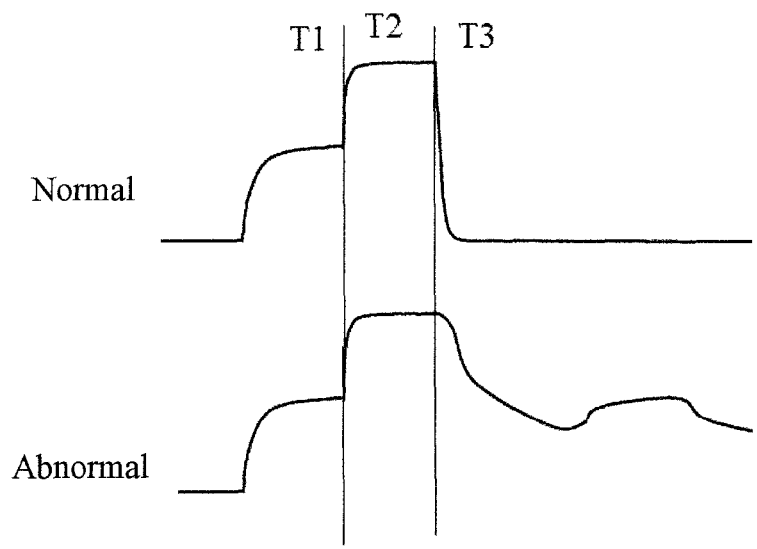
FIG. 5A is a timing sequence diagram of normal and abnormal signals at a pull-up node according to an embodiment of the present disclosure.
Figure 5B:
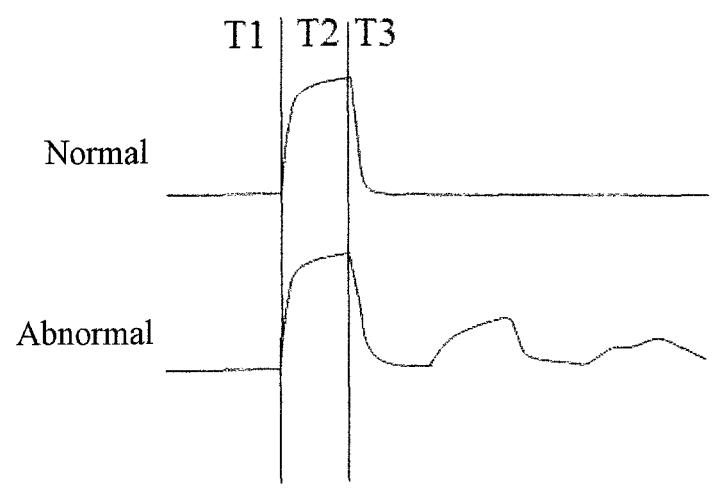
FIG. 5B is a timing sequence diagram of normal and abnormal output signals according to an embodiment of the present disclosure.

As described above, referring to FIG. 5A, the normal pull-up node PU signal is at the high level during the input phase T1 and the output phase T2, with the high level in the output phase T2 higher than the high level in the input phase T1, and at the low level during the reset phase T3. Hence, the normal output signal OUT is at the high level during the output phase T2 and at the low level during the input phase T1 and the reset phase T3, as shown in FIG. 5B. Referring to FIG. 5A, an abnormal pull-up node PU signal is at the high level during the input phase T1, the output phase T2 and the reset phase T3, resulting in an abnormal output signal OUT at the high level during the output phase T2 and the reset phase T3 and at the low level only during the input phase T1, as shown in FIG. 5B.

As described above, the access unit 2 corresponding to the gate driving unit 1 at each odd stage is configured to connect an output terminal of its corresponding gate driving unit 1 to the first signal line 3 when the high level is outputted from its corresponding gate driving unit 1 and when the high level is outputted from the gate driving unit 1 at the next stage to its corresponding gate driving unit 1 (at this time the low level is outputted from its corresponding gate driving unit 1). The output signals from the respective gate driving units at the odd stages on the first signal line 3 are alternately at the high level and the low level. Similarly, the access unit 2 corresponding to the gate driving unit 1 at each even stage is configured to connect an output terminal of its corresponding gate driving unit 1 to the second signal line 4 when the high level is outputted from its corresponding gate driving unit 1 and when the high level is outputted from the gate driving unit 1 at the next stage to its corresponding gate driving unit 1 (at this time the low level is outputted from its corresponding gate driving unit 1). The output signals from the respective gate driving units at the even stages on the second signal line 4 are alternately at the high level and the low level.

Figure 6A:
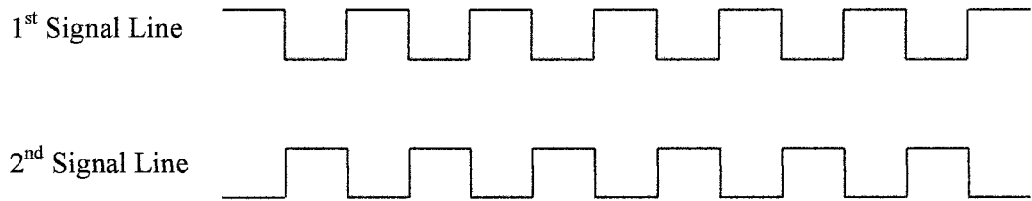
FIG. 6A is a timing sequence diagram of normal signals in a first signal line and a second signal line according to an embodiment of the present disclosure.

Referring to FIG. 2, the input signal IN to a particular gate driving unit is the output signal OUT from a gate driving unit at the previous stage, and the output signal OUT from the particular gate driving unit is the reset signal for the gate driving unit at the previous stage. In particular, at a first time instant, the gate driving unit at the first stage outputs the output signal OUT at the high level (which also serves as the input signal IN to the gate driving unit at the second stage) and the signal on the first signal line is at the high level. At a second time instant after the first time instant, the gate driving unit at the second stage outputs the output signal OUT at the high level (which also serves as the input signal IN to the gate driving unit at the third stage and the reset signal RESET for the gate driving unit at the first stage) and the signal on the second signal line is at the high level. At the same time, the gate driving unit at the first stage outputs the output signal OUT at the low level and the signal on the first signal line is at the low level. At a third time instant after the second time instant, the gate driving unit at the third stage outputs the output signal OUT at the high level (which also serves as the input signal IN to the gate driving unit at the fourth stage and the reset signal RESET for the gate driving unit at the second stage) and the signal on the first signal line is at the high level. At the same time, the gate driving unit at the second stage outputs the output signal OUT at the low level and the signal on the second signal line is at the low level, and so on. Accordingly, the signals on the first and second signal lines are normally square wave signals each having a constant period (i.e., the high levels and the low levels occur alternately), as shown in FIG. 6A.

In this case, if an output signal from a gate driving unit at a particular stage is abnormal, it will cause abnormal output signals from the gate driving units at the subsequent stages. That is, in one cycle during which the output signals from all the gate driving units are outputted to the first signal line and the second signal line, the signals on the first and second signal lines are square wave signals before the point corresponding to the output signal from the gate driving unit at the particular stage and remain at the high level afterwards (including at that point), as shown in FIG. 6A.

Figure 6B:
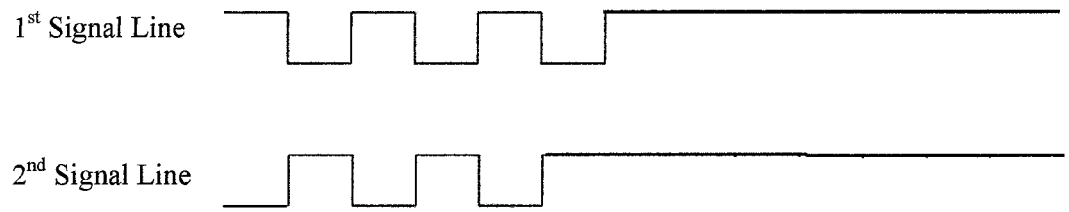
FIG. 6B is a timing sequence diagram of abnormal signals in a first signal line and a second signal line according to an embodiment of the present disclosure.

Further, with the above principle, it can be determined whether there is any defective gate driving unit and, if so, which of the gate driving unit is defective, based on the number of cycles of consecutive square wave signals on the first and second signal lines (i.e., the number of alternately occurring high and low levels). For example, in FIG. 6B, there are three cycles of consecutive square wave signals on the first signal line and two on the second signal line. Then the sixth gate driving unit is the defective one.

Figure 7:
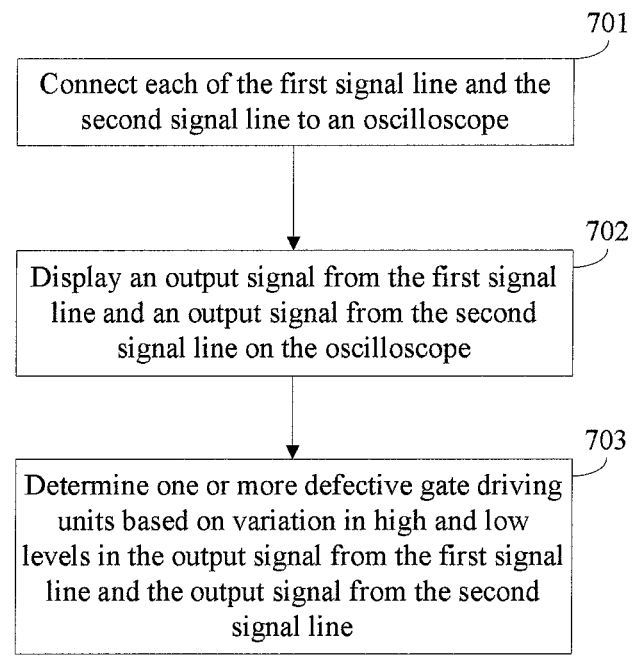
FIG. 7 is a flowchart illustrating a method for detecting a gate driving circuit according to an embodiment of the present disclosure.

In an embodiment of the present disclosure, a method for detecting a gate driving circuit is provided. The method can be applied to detect the gate driving circuit shown in FIG. 1 or FIG. 2. Referring to FIG. 7, the method includes the following steps.

At step S701, each of the first signal line and the second signal line is connected to an oscilloscope.

At step S702, an output signal from the first signal line and an output signal from the second signal line are displayed on the oscilloscope.

At step S703, one or more defective gate driving units are determined based on variation in high and low levels in the output signal from the first signal line and the output signal from the second signal line.

In particular, when the output signals on the first and second signal lines are always square wave signals having the same cycle, there is no gate driving unit that is defective. When a continuous high level occurs in the square wave signal having the same cycle in at least one of the output signal on the first signal line and the output signal on the second signal line, there is a defective gate driving unit. Here, the index of the stage at which the defective gate driving unit is located equals to the sum of the number of cycles of consecutive square wave signals on the first signal line and the number of cycles of consecutive square wave signals on the second signal line plus 1. For example, when there are three cycles of consecutive square wave signals on the first signal line and two on the second signal line, the sixth gate driving unit is the defective one.

In the embodiments of the present disclosure, a first signal line detects an output signal from the gate driving unit at each odd stage and a second signal line detects an output signal from the gate driving unit at each even stage, such that the output signals from the gate driving units at the respective stages are accessible via the first and second signal lines. In this way, it is possible to detect whether any of the gate driving units at the respective stages is defective by simply connecting the first and second signal lines to an oscilloscope, respectively, thereby allowing simple and convenient operations and significantly improved detection efficiency.

In an embodiment of the present disclosure, an array substrate is provided. The array substrate includes the gate driving circuit as shown in FIG. 1 or FIG. 2.

In the embodiments of the present disclosure, a first signal line detects an output signal from the gate driving unit at each odd stage and a second signal line detects an output signal from the gate driving unit at each even stage, such that the output signals from the gate driving units at the respective stages are accessible via the first and second signal lines. In this way, it is possible to detect whether any of the gate driving units at the respective stages is defective by simply connecting the first and second signal lines to an oscilloscope, respectively, thereby allowing simple and convenient operations and significantly improved detection efficiency.

In an embodiment of the present disclosure, a display apparatus is provided. The display apparatus includes the above array substrate.

In the embodiments of the present disclosure, a first signal line detects an output signal from the gate driving unit at each odd stage and a second signal line detects an output signal from the gate driving unit at each even stage, such that the output signals from the gate driving units at the respective stages are accessible via the first and second signal lines. In this way, it is possible to detect whether any of the gate driving units at the respective stages is defective by simply connecting the first and second signal lines to an oscilloscope, respectively, thereby allowing simple and convenient operations and significantly improved detection efficiency.

While the embodiments of the present invention have been described above, the scope of the present invention is not limited thereto. Various modifications, alternatives and improvements can be made by those skilled in the art without departing from the scope of the present disclosure. These modifications, alternatives and improvements are to be encompassed by the scope of the present invention.

What is claimed is:

1. A gate driving circuit, comprising a plurality of cascaded gate driving units, wherein the gate driving circuit further comprises an access unit corresponding to each of the gate driving units, a first signal line and a second signal line, each access unit being connected to its corresponding gate driving unit and the gate driving unit at the next stage to its corresponding gate driving unit, and wherein the access unit corresponding to the gate driving unit at each odd stage is connected to the first signal line such that the first signal line detects an output signal from that gate driving unit via the access unit, and the access unit corresponding to the gate driving unit at each even stage is connected to the second signal line such that the second signal line detects an output signal from that gate driving unit via the access unit.

2. The gate driving circuit of claim 1, wherein the access unit corresponding to the gate driving unit at each odd stage is configured to connect an output terminal of its corresponding gate driving unit to the first signal line in response to an output signal from its corresponding gate driving unit and an output signal from the gate driving unit at the next stage to its corresponding gate driving unit, and the access unit corresponding to the gate driving unit at each even stage is configured to connect an output terminal of its corresponding gate driving unit to the second signal line in response to an output signal from its corresponding gate driving unit and an output signal from the gate driving unit at the next stage to its corresponding gate driving unit.

3. An array substrate, comprising the gate driving circuit according to claim 2.

4. A display apparatus, comprising the array substrate according to claim 3.

5. A method for detecting the gate driving circuit according to claim 2, comprising:

connecting each of the first signal line and the second signal line to an oscilloscope;

displaying an output signal from the first signal line and an output signal from the second signal line on the oscilloscope; and determining one or more defective gate driving units based on variation in high and low levels in the output signal from the first signal line and the output signal from the second signal line.

6. The gate driving circuit of claim 1, wherein each access unit comprises a first transistor and a second transistor, a gate of the first transistor, a first terminal of the first transistor and a first terminal of the second transistor are each connected to an output terminal of the gate driving unit corresponding to the access unit, a gate of the second transistor is connected to an output terminal of the gate driving unit at the next stage to the gate driving unit corresponding to the access unit, and a second terminal of the first transistor and a second terminal of the second transistor are each connected to the first signal line or the second signal line.

7. The gate driving circuit of claim 6, wherein the gate driving unit comprises a plurality of transistors and leads connected to the plurality of transistors, the first transistor and the second transistor are manufactured simultaneously with the plurality of transistors and the first signal line and the second signal line are manufactured simultaneously with the leads.

8. An array substrate, comprising the gate driving circuit according to claim 7.

9. A display apparatus, comprising the array substrate according to claim 8.

10. A method for detecting the gate driving circuit according to claim 7, comprising:

connecting each of the first signal line and the second signal line to an oscilloscope;

displaying an output signal from the first signal line and an output signal from the second signal line on the oscilloscope; and determining one or more defective gate driving units based on variation in high and low levels in the output signal from the first signal line and the output signal from the second signal line.

11. An array substrate, comprising the gate driving circuit according to claim 6.

12. A display apparatus, comprising the array substrate according to claim 11.

13. A method for detecting the gate driving circuit according to claim 6, comprising:

connecting each of the first signal line and the second signal line to an oscilloscope;

displaying an output signal from the first signal line and an output signal from the second signal line on the oscilloscope; and determining one or more defective gate driving units based on variation in high and low levels in the output signal from the first signal line and the output signal from the second signal line.

14. The gate driving circuit of claim 1, wherein the respective access units, the first signal line and the second signal line are arranged at respective output terminals of the gate driving units.

15. The gate driving circuit of claim 1, wherein one end of the first signal line and one end of the second signal line each have a test pad connected to an oscilloscope.

16. The gate driving circuit of claim 15, wherein the one end of the first signal line and the one end of the second signal line are located at one side of the gate driving circuit.

17. An array substrate, comprising the gate driving circuit according to claim 1.

18. A display apparatus, comprising the array substrate according to claim 17.

19. A method for detecting the gate driving circuit according to claim 1, comprising:

connecting each of the first signal line and the second signal line to an oscilloscope;

displaying an output signal from the first signal line and an output signal from the second signal line on the oscilloscope; and determining one or more defective gate driving units based on variation in high and low levels in the output signal from the first signal line and the output signal from the second signal line.

* * * * *